United States Patent [19]
Sun

[11] Patent Number: 6,130,814
[45] Date of Patent: Oct. 10, 2000

[54] CURRENT-INDUCED MAGNETIC SWITCHING DEVICE AND MEMORY INCLUDING THE SAME

[75] Inventor: Jonathan Zanhong Sun, Mohegan Lake, N.Y.

[73] Assignee: International Business Machines Corporation, Armonk, N.Y.

[21] Appl. No.: 09/123,523

[22] Filed: Jul. 28, 1998

[51] Int. Cl.$^7$ .................................................. G11C 11/00
[52] U.S. Cl. ............................................ 361/143; 361/139
[58] Field of Search ...................................... 361/139, 143

[56] References Cited

U.S. PATENT DOCUMENTS

| | | |
|---|---|---|
| 5,173,873 | 12/1992 | Wu et al. . |
| 5,251,170 | 10/1993 | Daughton et al. . |
| 5,329,486 | 7/1994 | Lage . |
| 5,541,868 | 7/1996 | Prinz . |
| 5,587,943 | 12/1996 | Torok et al. . |
| 5,650,958 | 7/1997 | Gallagher et al. . |
| 5,695,864 | 12/1997 | Slonczewski . |
| 5,745,406 | 4/1998 | Yamane et al. . |
| 5,825,685 | 10/1998 | Yamane et al. .......................... 365/158 |

OTHER PUBLICATIONS

Abstract of JP409139068, Yamane et al., May 27, 1997.

*Primary Examiner*—Fritz Fleming
*Attorney, Agent, or Firm*—McGinn & Gibb, P.C.

[57] ABSTRACT

A magnetic switching device, includes a first electrode, a second electrode, and a nanoparticle having a magnetic moment and being disposed between the first and second electrodes. At least one of the first electrode and the second electrode includes a magnetic material which has a net spin polarization in its conduction band for injecting, into the nanoparticle, an electrical current including a net spin polarization for overcoming the magnetic moment of the nanoparticle upon selection of a predetermined magnitude for the electrical current.

20 Claims, 4 Drawing Sheets

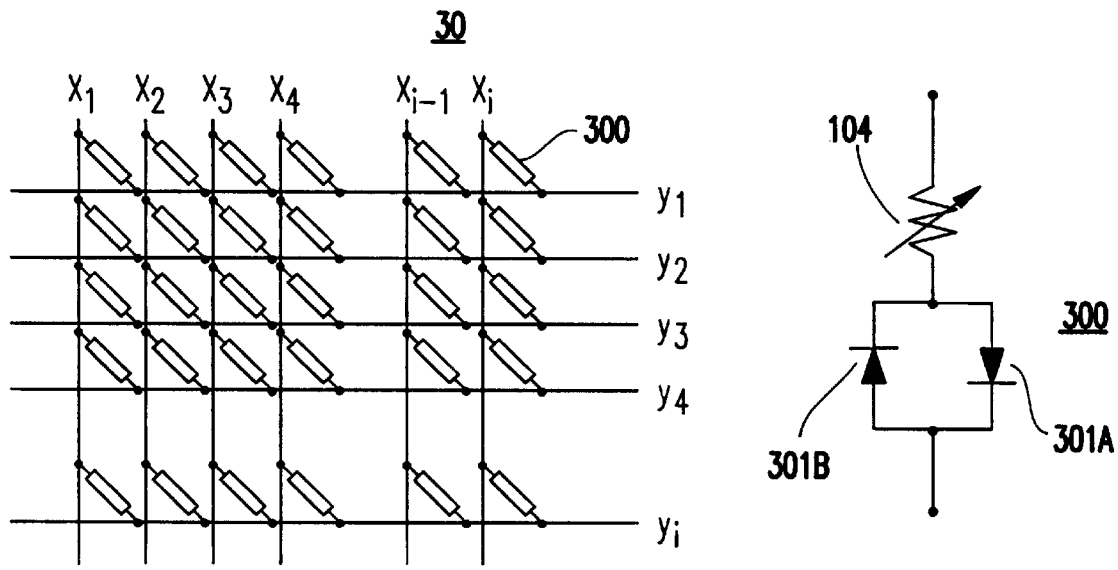
FIG.3A
FIG.3B
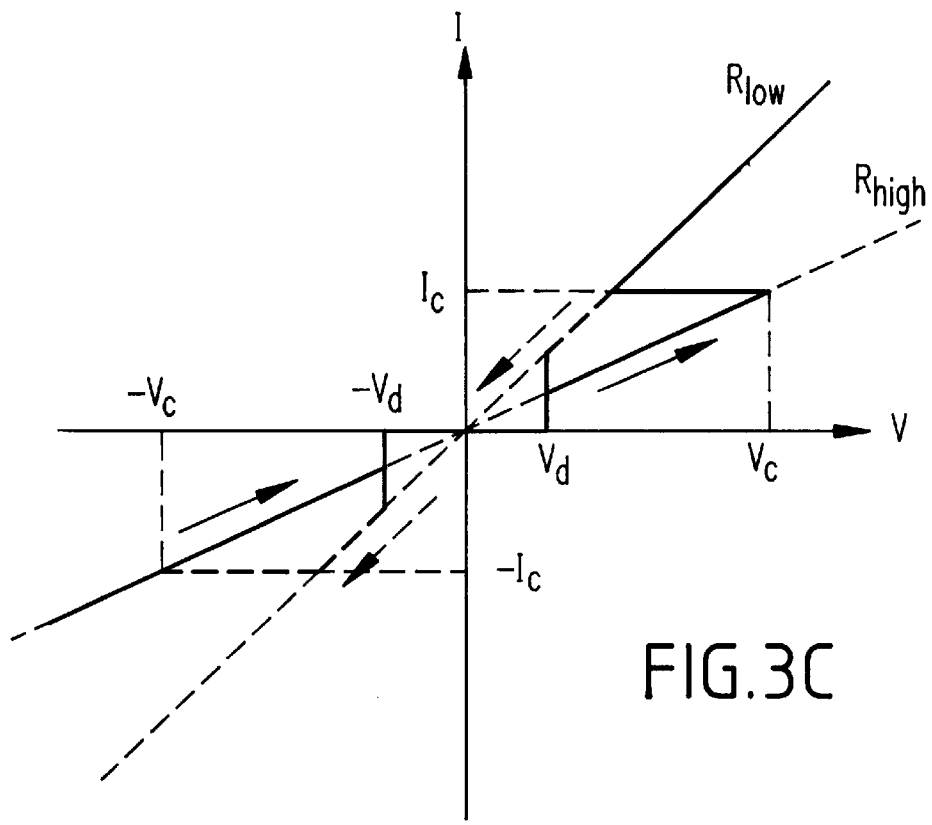
FIG.3C

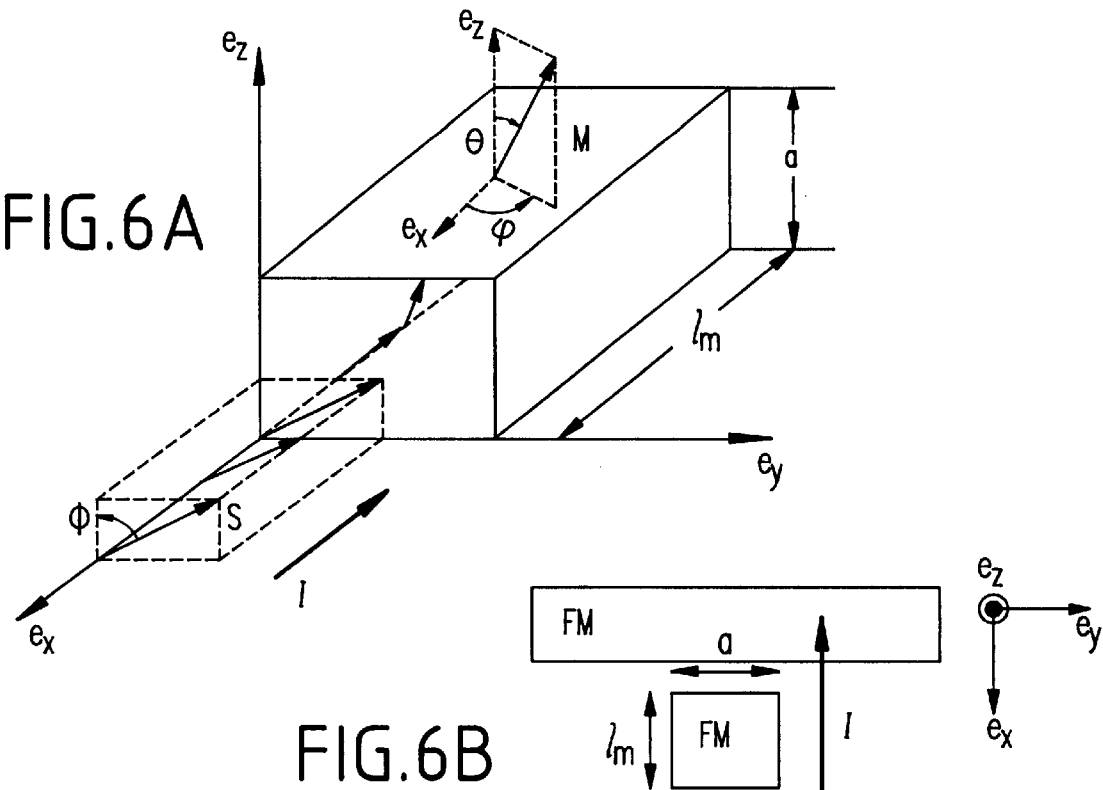
FIG. 6A
FIG. 6B
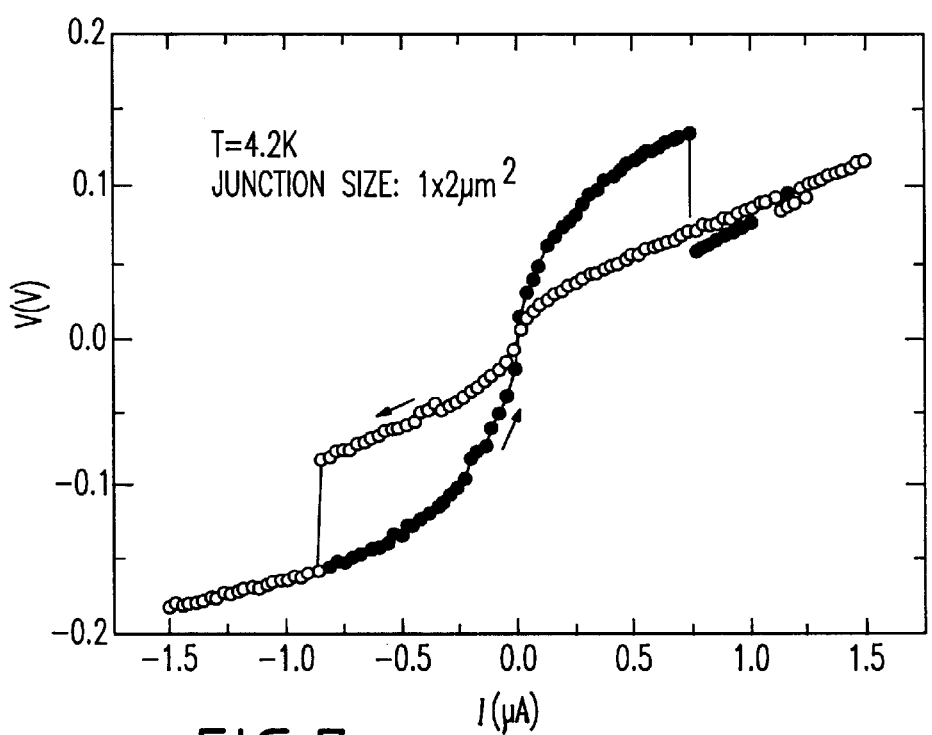
FIG. 7

CURRENT-INDUCED MAGNETIC SWITCHING DEVICE AND MEMORY INCLUDING THE SAME

BACKGROUND OF THE INVENTION

1. Field of the Invention

The present invention generally relates to a switching device, and more particularly to a current-induced magnetic switching device for use with a nonvolatile memory array that uses magnetic memory elements as the individual memory cells.

2. Description of the Related Art

Magnetic random access memory (MRAM or typically referred to as "MagRam") technology is a solid state device technology using magnetic thin film elements as a storage mechanism. The storage mechanism relies on the relative orientation of the magnetization of two electrodes, and on the ability to discern this orientation by electrical means.

MRAM arrays include an array of magnetic memory cells positioned at the intersections of wordlines and bitlines. Generally, each cell includes a magnetically changeable or "free" region, and a proximate magnetically reference region, arranged into a magnetic tunnel junction ("MTJ") device (e.g., the term "reference region" is used broadly herein to denote any type of region which, in cooperation with the free or changeable region, results in a detectable state of the device as a whole).

Generally, the principle underlying storage of data in such cells is the ability to change the relative orientation of the magnetization of the free and reference regions by changing the direction of magnetization along the easy axis ("EA") of the free region, and the ability to thereafter read this relative orientation difference.

More particularly, an MRAM cell is written by reversing the free region magnetization using applied bi-directional electrical and resultant magnetic stimuli via its respective bitline and wordline.

The MRAM cell is later read by measuring the resultant tunneling resistance between the bitline and wordline, which assumes one of two values depending on the relative orientation of the magnetization of the free region with respect to the reference region. If the free region is modeled as a simple elemental magnet having a direction of magnetization which is free to rotate but with a strong preference for aligning in either direction along its easy axis (+EA or –EA), and if the reference region is a similar elemental magnet but having a direction of magnetization fixed in the +EA direction, then two states (and therefore the two possible tunneling resistance values) are defined for the cell: aligned (+EA/+EA) and anti-aligned (–EA/+EA).

Thus, in operation as a memory device, the MRAM device can be read by measuring the tunneling resistance, thereby to infer the magnetization state of the storage layer with respect to the fixed layer. The MRAM can be written by reversing free layer magnetization using external magnetic fields. If the free layer is imagined as a simple elemental magnet which is free to rotate but with a strong energetic preference for aligning parallel to the X axis, and if the pinned layer is a similar elemental magnet but frozen in the +X direction, then there are at least two states possible for the device (e.g., aligned and anti-aligned) (i.e., in +X or –X directions).

Thus, a magnetic random access memory (RAM) requires write operations on small ferromagnetic elements. The conventional way of write-addressing has been to use an x-y cross-current excitation, which requires large write current, demands stringent magnetic switching characteristic from the memory element, and has cross-talk problems upon the increase of memory density.

Further, the conventional structures and methods do not allow for high packing density without cross-talk. Further, the driving circuits become complex due to the x-y selective magnetic-field induced write operation. Thus, conventional magnetic random access memory (RAM) requires read-write operations on small ferromagnetic elements, and have any problems.

A mechanism for the direct switching of the magnetic memory element has been proposed in J. C. Slonczewski, J. Magn. and Magn. Mat. 159, LI (1996), which is based on the theoretical prediction of a new effect due to interactions between spin-polarized conduction electrons and the ferromagnetic moments of the electrodes. However, such a proposal was strictly theoretical.

Further, in M. Tsoi et al., *Phys. Rev. Lett.*, 80, 4281 (1998), a point-contact device was constructed to show an anomaly in its current-voltage characteristic, which could be interpreted as spin-wave excitation due to the momentum transfer effect mentioned above. However, such a model was strictly hypothetical.

Further, it is noted that recently in manganite trilayer junctions, large low-field magnetoresistance (MR), of up to an order of magnitude change in resistance, was observed at 14° K. in 100 Oe. The junctions are made of epitaxial $La_{0.67}(Sr/Ca)_{0.33}MnO_3$ (LSMO or LCMO) thin film electrodes with a $SrTiO_3$ (STO) barrier. These manganites are expected to be half-metals when their ferromagnetic order is fully developed. Band calculations show that their minority band has a very low carrier concentration, making it prone to disorder-induced localization.

According to a spin-dependent tunneling model, a half-metallic metal-insulator-metal junction would exhibit large, almost infinite MR. However, the observed transport characteristics do not resemble a clean metal-insulator-metal toweling junction. The resistance varies strongly with temperature, especially above 130° K. The MR decreases rapidly as temperature increases, vanishing above 130° K., well below the Curie temperature of the thin film electrodes which is around 360° K. The MR is bias-dependent, suppressed by a voltage of around 0.2V. Inhomogeneities of transport current at the junction interface is suspected, and the exact mechanism for such large low-field MR is not well understood.

SUMMARY OF THE INVENTION

In view of the foregoing and other problems of the conventional structures and methods, an object of the present invention is to provide a structure and method which is optimal for small magnetic memory structure where magnetic switching thresholds are more stable than the conventional techniques.

Another object is to provide a write-operation that allows for high packing density without cross-talk.

A further object is to provide a structure in which simpler driving circuits are employed.

In a first aspect of the present invention, a magnetic switching device includes a first electrode, a second electrode, and a nanoparticle having a magnetic moment and being disposed therebetween, at least one of the first electrode and the second electrode including a magnetic material which has a net spin polarization in its conduction band for injecting, into the nanoparticle, an electrical current including a net spin polarization for overcoming the magnetic moment of said nanoparticle upon selection of a sufficient magnitude for the electrical current.

With the present invention, a magnetic switch is provided in which switching is caused by a current having a net spin which arises in one electrode of a two-electrode device having a magnetic nanoparticle therebetween. The one electrode includes a magnetic material including a net spin polarization in its conduction band. The magnetic interaction of the spin-polarized current can be used to rotate the magnetic moment of the nanoparticle, thereby switching the resistance state for current flow between the two electrodes.

Thus, with the unique and unobvious structure and technique of the present invention, the invention is optimized for small magnetic memory structures where magnetic switching thresholds are more stable than the conventional techniques. Further, high packing density without cross-talk is achieved. Moreover, simpler driving circuits may be employed with the invention as compared to the conventional structures and techniques.

BRIEF DESCRIPTION OF THE DRAWINGS

The foregoing and other objects, aspects and advantages will be better understood from the following detailed description of a preferred embodiment of the invention with reference to the drawings, in which:

FIG. 3A illustrates x-y read-write grid of a magnetic RAM architecture using devices with an IV characteristic as illustrated in FIG. 2;

FIG. 3B illustrates the devices at each node composed of a magnetorestrictive element in series with a pair of back-to-back diodes;

FIG. 3C illustrates a conceptual diagram of a the two-terminal IV characteristic for the circuit shown in FIG. 3B;

FIG. 6A illustrates the geometry considered of a model employed with the present invention;

FIG. 6B illustrates an exemplary conduction mechanism at the junction interface; and FIG. 7 illustrates an example of the l-V characteristic of the junction showing a clean switching characteristic.

DETAILED DESCRIPTION OF A PREFERRED EMBODIMENT OF THE INVENTION

Figure 1:
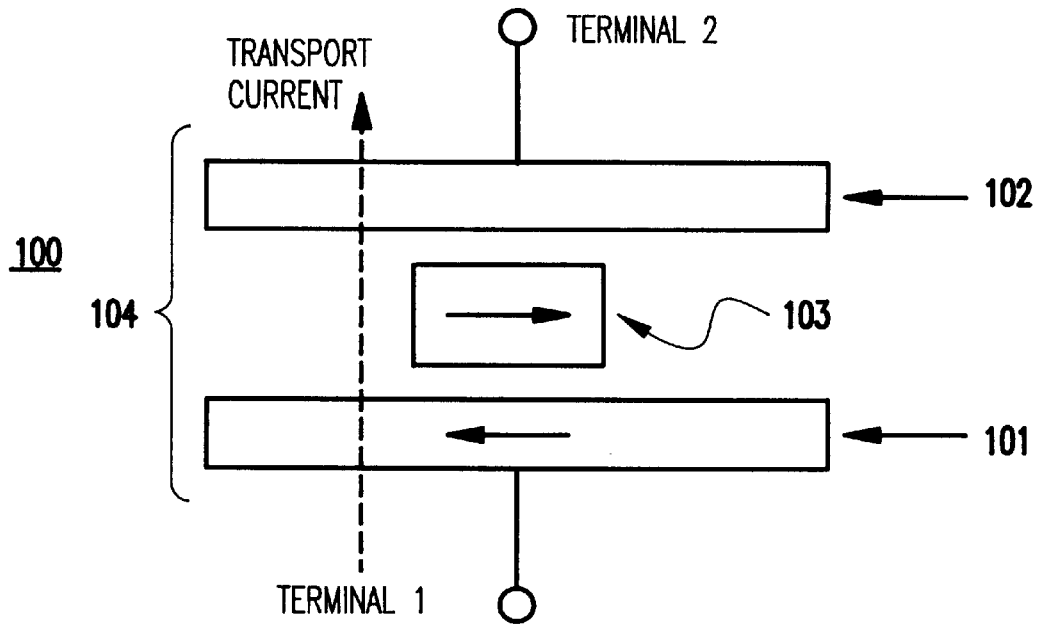
FIG. 1 is a schematic diagram of the preferred structure of a current-driven magnetic switch according to the present invention.

Referring now to the drawings, and more particularly to FIGS. 1–3C, there is shown a preferred embodiment of the present invention.

Generally, the present invention improves upon the conventional devices in terms of the read/write operation and other operations. The present invention is based on momentum transfer from spin-polarized conduction carriers. The technique and structure of the present invention are intrinsically optimal for small magnetic memory structures, where magnetic switching thresholds are more stable. The invention allows extremely high packing density without cross-talk. Further, the invention and its objectives are achieved by simpler driving circuits than the current architecture of an x-y selective magnetic-field induced write.

The invention has been verified by experimental results which verify the quantitative model and finds especially great benefit in a magnetic RAM architecture for a new magnetic memory element, and which are discussed in regard to FIGS. 4–7 below.

The present invention discloses a current-driven magnetoresistive switch. The inventive switch constitutes the basic storage element for a new magnetic RAM architecture. In this architecture according to the present invention, separate wiring levels for the "write" operation are unnecessary. The "write" operation can be accomplished using the same x-y read-out grid and by momentarily biasing the magnetoresistive switch up to a current level above its switching threshold, causing it to change its magnetic state, thus accomplishing the function of "writing".

Referring to FIG. 1, the inventive structure 100 is shown as exemplarily embodied as a switch.

FIG. 1 illustrates a preferred embodiment of a current-driven magnetic switch 100 according to the present invention. In FIG. 1, the switch 100 includes a two-terminal junction which is constructed in which at least one (e.g., one or both) of the leads of the junction is made of ferromagnetically ordered metallic material (including conducting magnetic oxides). Examples of candidate electrode materials include (but are not limited to) at least one of Fe, Co, $Ni_{1-x}Fe_x$, $CrO_2$, $La_{0.67}Sr_{0.33}MnO_3$, $La_{0.67}Ca_{0.33}MnO_3$, and alloys thereof, etc.

Specifically, first and second electrodes 101, 102 are provided with a magnetic nanoparticle 103 situated between the first electrode 101 and the second electrode 102. Candidate materials for the nanoparticles include (but are not limited to) at least one of Fe, Co, $Ni_{1-x}Fe_x$, $CrO_2$, $La_{0.67}Sr_{0.33}MnO_3$, $La_{0.67}Ca_{0.33}MnO_3$, and alloys thereof, etc.

As shown in FIG. 1, structural elements 101–103 and 102–103 form two magnetic junctions 104 between the two terminals. The first electrode 101 and the magnetic nanoparticle are ferromagnetically ordered. The second electrode 102 may or may not be ferromagnetic, but preferably also is ferromagnetic for bi-polar operations.

The magnetic nanoparticle 103 is electrically connected to both the first and second electrodes, 101, 102, either by spin-dependent tunneling, or via some other conduction mechanism (such as filamentary conduction, point-contact conduction, etc.) that preserves the spin-information of the conduction carriers. The relative alignment of the magnetic moment between the magnetic nanocluster and the ferromagnetic (FW electrodes 101 and 102 determines the two-terminal resistance of the device 100. The arrows illustrate the magnetic orientation of the electrode and the nanoparticle.

Figure 2:
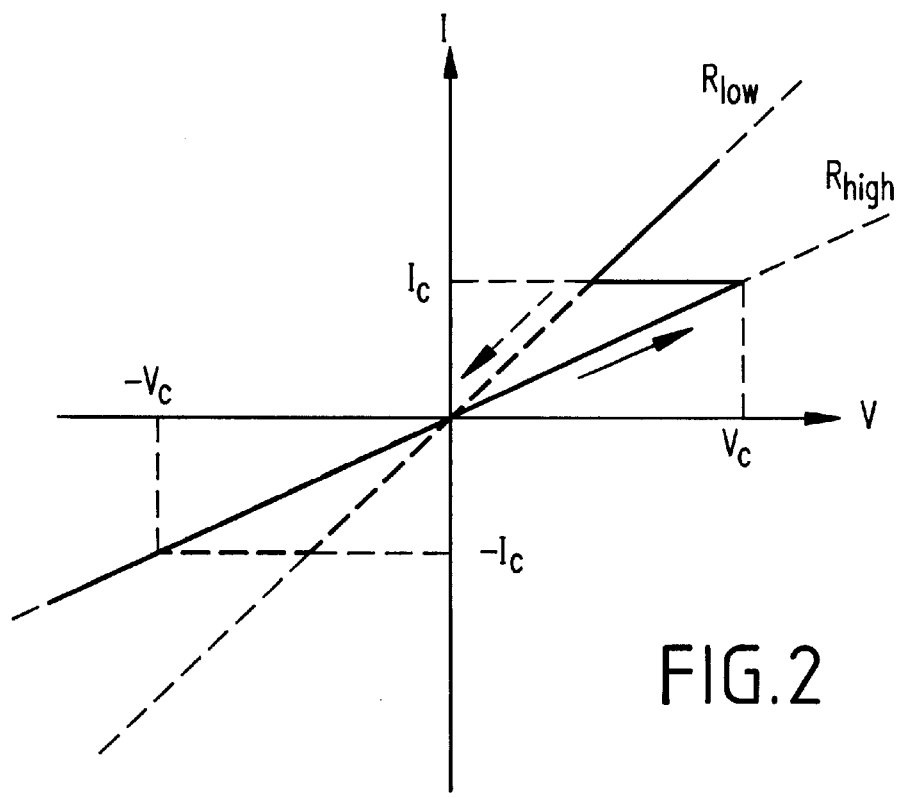
FIG. 2 illustrates a bi-stable TV characteristic of a junction constructed as shown in FIG. 1.

Hence, in FIG. 1, arrows represent the ferromagnetic moment. In S the actual design of the device, the magnetic moment may assume different orientations as fitting for the optimal performance of the device's IV characteristic, as shown in FIG. 2.

As mentioned above, the second electrode 102 may or may not be ferromagnetic, but preferably the electrode 102 is ferromagnetic since it is advantageous in terms of bipolar operations, having + and $-I_C$, and for ease of manufacturing. Moreover, for the IV characteristics shown in FIG. 2, it is necessary for the second electrode also to be formed of ferromagnetic material.

The magnetic nanoparticle 103 is electrically connected to both the first and second electrodes, 101, 102, either by spin-dependent tunneling, or via some other conduction mechanism (e.g., such as point-contact or filamentary conduction) that preserves the spin-information, thereby resulting in having a two-terminal resistance sensitive to the relative alignment of magnetic moments between the first electrode and the magnetic nanoparticle. A small (e.g., $|I_{sense}|<|I_c|$; in an exemplary case ~1 $\mu$A) transport current is used to sense the two-terminal resistance of the device 100.

When transport current is increased beyond a certain threshold value, $I_C$, (e.g., $I_C$~1 $\mu$A; for room temperature operation, $I_C \geq 100$ $\mu$A is expected, as discussed below), a rotation of the magnetic orientation of the magnetic nanoparticle 103 results, thereby changing the device's resistance.

As shown in FIG. 2, a bi-stable current-voltage (IV) characteristic of such a device is shown. Specifically, FIG. 2 illustrates a bi-stable IV characteristic of a junction constructed as exemplarily shown in FIG. 1. The magnetic anisotropy energy, the amount of spin-polarization in the conduction band, and the effective Landau-Gilbert damping coefficient of the nanostructure determine the position of the threshold currents $I_C$ and $-I_C$. The two threshold currents in the + and − direction may or may not be equal in value.

Depending upon the orientation of the magnetic moment of the nanoparticle 103 with respect to the first and second electrodes, 101, 102, the junction may either be in its resistive-high ($R_{high}$) or resistive-low ($R_{low}$) state.

When a transport current exceeds the threshold $I_C$, the magnetic moment of the nanoparticle 103 flips, causing a switch of the resistance state. This current-voltage (In) characteristic is a conceptual drawing for a magnetic nanoparticle 103 with uniaxial magnetic anisotropy. In principle, more than two stable states may be possible in such a device if the magnetic nanoparticle has a more complex magnetic anisotropy energy.

Thus, with properly chosen materials parameters (such as anisotropy field HKI size of the nanoparticle etc. (e.g., see Equations (2)–(5) below), it is possible to make such a device with a current-voltage characteristic as shown in FIG. 2.

Essentially, the device characteristic calls for a nanocluster with an energy product in the range of several hundred Kelvin (e.g., ~600° K.), corresponding to a threshold current $I_C$ of the order of $I_C$>~100 $\mu$A, and a magnetic nanoparticle of the size of several hundred A (e.g., 300 Å for $Ni_{0.60}Fe_{0.40}$ particle (Permalloy)). Preferably, a large spin-polarization of conduction band (e.g., "large" being in a range of about $\eta$~0.1 to 1.0) is desirable because that makes the difference between these two states described in FIG. 2 more distinguishable in resistance.

A memory array 30 may be constructed with the two-terminal device described above having such characteristics. For example, an exemplary architecture is illustrated in FIG. 3A having a plurality of structures 300 at intersections of the x-y grid (e.g., bitline-wordline grid).

In FIG. 3B, a structure 300 is shown such that a pair of back-to-back diodes 301A, 301B is placed in series with each magnetic junction 104 to allow selective read-addressing. The same addressing circuit can be used for selective "write" operations. To do so, a supply cell (x;, yj) with a bias current exceeding +$I_C$ or −$I_C$. Is employed.

With properly chosen $I_C$ and $V_C$ as defined in FIG. 3C, the $I_C$ of only one junction situated at ($x_i$, $y_j$) may be selectively exceeded while keeping all other junctions unchanged.

Thus, in FIGS. 3A–3C, an exemplary construction is shown of a magnetic RAM architecture making use of devices with an IV characteristic as illustrated in FIG. 2. In FIG. 3A, an x-y read-write grid is shown, whereas FIG. 3B illustrates the device at each node which includes a magnetoresistive element 104 (i.e., device 100) in series with a pair of back-to-back diodes.

FIG. 3C illustrates a conceptual diagram of the two-terminal IV characteristic for the circuit shown in FIG. 3B. A bias current below $I_C$ reads out the resistance of the magnetoresistive element. A bias current above $I_C$ switches it. Selective "read" of a node at ($x_i$, $y_j$) can be accomplished by biasing line $x_I$ above Vd and line yj below −$V_d$. A proper selection of the magnetoresistive element's resistances $R_{high}$ and $R_{low}$ and its threshold current $I_C$ would allow the same biasing scheme to be used for driving a single element at ($x_i$, $y_j$) above its critical current $I_C$, accomplishing the "write" operation.

Thus, the present invention provides a magnetic nanocluster junction including a ferromagnetic electrode, a ferromagnetic nanoparticle or other nanostructures, and a counter electrode, as illustrated in FIG. 1.

Additionally, the present invention provides a current-driven magnetic switch with an exemplary, non-limiting structure illustrated in FIG. 1A that has an exemplary two-terminal current-voltage characteristic as illustrated in FIG. 2.

Further, the present invention provides a magnetic random-access memory architecture as illustrated in FIGS. 3A–3C, in which the current-driven switch as described above and illustrates in accordance with the current-voltage characteristic of FIG. 2 is used as the basic memory cell. Both read and write function are achieved using the same addressing circuit.

Thus, the present invention provides a magnetic switch in which switching is caused by a current having a net spin which arises in one electrode of a two-electrode device having a magnetic nanoparticle therebetween. The one electrode includes a magnetic material including a net spin polarization in its conduction band. The magnetic interaction of the spin-polarized current can be used to overcome the magnetic moment of the nanoparticle, thereby switching the resistance state for current flow between the two electrodes.

Other addressing methods also can be used in conjunction with the inventive magnetoresistive switch (e.g., element 104 in FIG. 3B). Some examples of different address methods are described, for example, in R. E. Matick, *Computer Storage System and Technology*, John Wiley & Sons (1977), Chapter 4.10, page 321.

Thus, the present inventor has observed a new effect in these junctions, and namely a current-induced switching of magnetic state. This phenomenon sheds new light onto the materials physics at the junction interface.

The present invention provides a model based on spin-dependent transport across the junction interface via magnetic nanoclusters, and coherently describes the origin for the temperature and field dependence of the junction's transport characteristics. The model of the invention also has lead to the concept of a spin-current-driven switch that forms the basic storage element for a new type of magnetic random access memory, and as described above.

It is noted that LSMO/STO/LSMO trilayer junctions are used for this study. Regarding fabrication, briefly, the trilayers were grown epitaxially on $NdGaO_3$ (110) substrates (NGO) using laser ablation at a substrate temperature of 750° C. The junctions were formed, for example, using optical photolithography and ion-milling. The bottom layer LSMO is about 600 Å thick, and the top LSMO is about 400 Å thick. The barrier STO is nominally 30 Å thick, and the roughness at the junction interface is estimated to be less than 15 Å.

The dc resistance of the junction in its resistive-high and resistive-low state are defined as $R_{high}$ and $R_{low}$ respectively. These junctions show large magnetoresistance at low temperature. A ratio of $R_{high}/R_{low}$=9.7 has been observed at 14° K. and 100 Oe. Below, the transport properties of such junctions with large magnetoresistance are further discussed.

Figure 4:
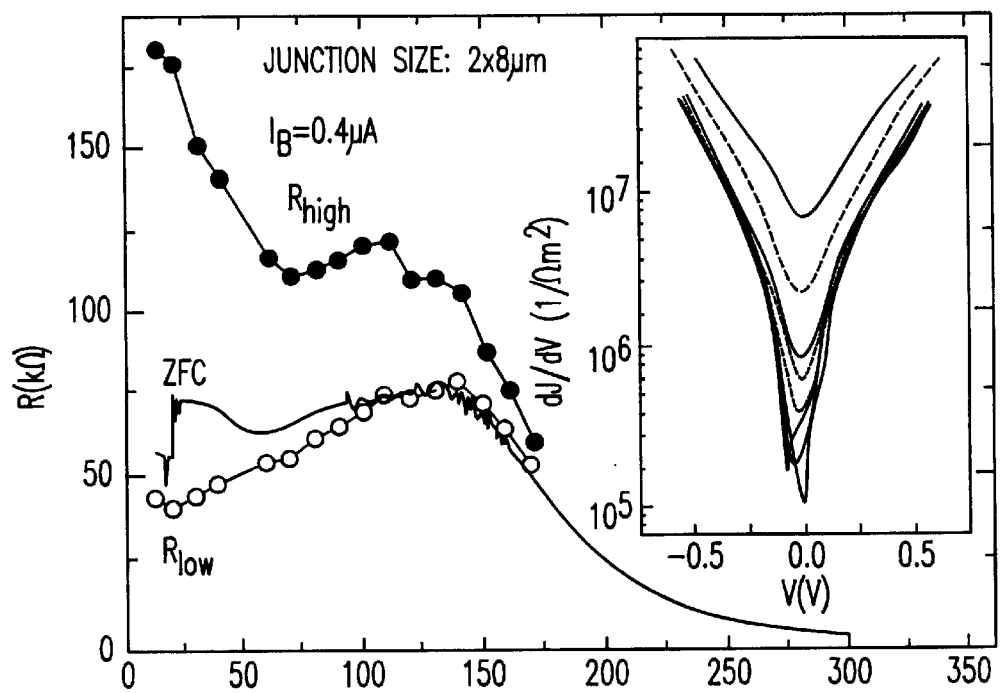
FIG. 4 illustrates the temperature-dependent resistance of a junction resistance.

FIG. 4 illustrates a representative temperature dependence curve of a junction resistance, R(7). The junction is 2×8 $\mu m^2$ in size. For the zero field current (ZFC) curve, data were collected during cooling in a nominally zero field (e.g., a residual field of around 1 Oe is expected). Bias current was swept between ±0.4 $\mu A$ for each temperature point, and the least-square slope is taken as the junction resistance. Curves $R_{high}$ and $R_{low}$ indicate the dc junction resistance In resistive-high and -low state, respectively, at 0.4 $\mu A$ of junction bias current.

The inset of FIG. 4 illustrates the evolution of differential conductance of the junction as a function of temperature. For curves from the top down, the corresponding temperatures 250° K., 200° K., 160° K., 140° K., 120° K., 80° K., 40° K., and 13° K., respectively. As shown, a low-bias conductance minimum steadily develops at low temperature, becoming noticeable first around 150° K.

Thus, FIG. 4 shows the temperature-dependent resistance of a 2×8 $\mu m^2$ junction, characteristic of these devices. Upon cooling from the ambient, junction resistance R(X) first increases. Below 130° K, R(T) flattens, becomes more noisy, and the device begins to show a significant MR. The noise in the data is due to magnetic instabilities in the electrodes. The current-voltage characteristic is nonlinear. A low-bias conductance minimum develops for temperatures below 150° K. and biases below 0.2 eV, as shown in the inset of FIG. 1.

For many junctions, the current-voltage (IV) characteristics contain abrupt steps at well defined currents, usually for temperatures below 50° K. and in the current range of 0.5–5 $\mu A$. For some junctions, the steps are very large, and they often correspond to the field-induced transition of the junction magnetoresistance from $R_{low}$ to $R_{high}$ state. These steps show up in differential conductance as peaks as can be seen in the inset of FIG. 1.

Figure 5:
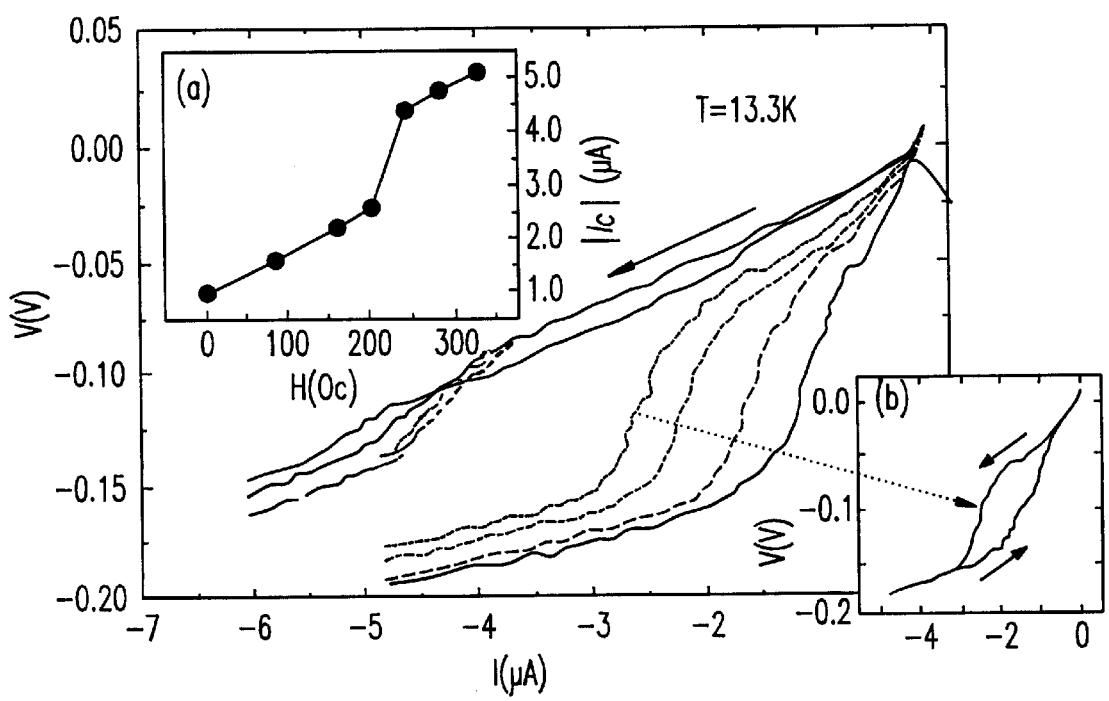
FIG. 5 illustrates an example of a step in the current-voltage Iv) characteristic.

FIG. 5 illustrates one example of a step in the IV characteristic. Each curve represents 200 trace-averages. The step position $I_C$ has a certain distribution, which softens the step shown in these curves. $I_C$ moves out as the applied field is increased. For curves shown in FIG. 5, the applied fields are, from right to left: 1.6 Oe, 83 Oe, 163 Oe, 202 Oe, 244 Oe, 287 Oe, and 331 Oe, respectively. The inset (a) of FIG. 5 shows the $I_C$'s dependence on magnetic field H. The IVs are generally hysteretic. One trace with hysteresis is shown in inset (b) of FIG. 5. For clarity, only curves with increasing-sweep of current are shown in the main panel, as indicated by the arrow.

Thus, FIG. 5 shows more details of one such step observed in IV characteristics. The transition occurs at a critical current $I_C$–1 $\mu A$ in zero field (the IV is asymmetric in this case. No corresponding transition was observable at +1 $\mu A$). The value of $I_C$ is not always exactly the same between different traces of IVs.

For a given set of measurement conditions (fixed temperature, field, and amplitude of IV sweep), the value of $I_C$ distributes within a narrow band, making the step appear rounded after trace-averaging, as shown in FIG. 5. The mean-center position of $I_C$ (defined as the peak position of dV/dI) shows a systematic dependence on the applied magnetic field, suggesting the involvement of a magnetic process. The step was from high-conductance to low-conductance when the bias current exceeds $I_C$. The sudden change of $I_C$(H) around 200 Oe is indicative of a change in ground-state magnetization direction for the magnetic cluster.

The present invention shows below that such behavior is consistent with spin-dependent transport through a magnetic nanoparticle, when the interaction between spin-polarized transport current and the ferromagnetic moment of the nanocluster is included. As shown, transport across junction interface is via clusters residing at the junction interface. For certain conditions, one such cluster could dominate the transport. This is the example considered for data presented in FIG. 5.

Interaction between spin-polarized transport current and ferromagnetic electrode has been of recent theoretical interest, and this interaction has been investigated theoretically in several different configurations. Recently, experimental observations were made of spin-current excitations in a device with point-contact transport into a thin film superlattice of Co/Cu. The essence of the physics is the existence of a spin-momentum transfer between the spin-polarized conduction electron and the magnetic moment in the electrode.

FIG. 6A illustrates the geometry considered when deriving Equation 1 and specifically shows an exemplary model used, whereas FIG. 6B illustrates an exemplary conduction mechanism at the junction interface. The dominant conduction channel is through a single magnetic cluster, assumed to be $a^2$ on the side and $1_m$ in length. Ferromagnetic electrodes are designated as "FM".

Regarding the physics, assuming a transport current with spin-polarization factor $\eta=(n_\circ-n_1)/(n_{\circ+n1})$, where $n_{\circ,1}$ are carrier densities in the spin-up and the spin-down channels, respectively. $|\eta|=1$ corresponds to complete spin-polarization.

Assume the current enters the front side of the ferromagnetic particle with its spin making an angle $\Phi$ with the $e_z$ axis, which is the initial direction of M, as illustrated in FIG. 6A. After a distance $1_m$ along $-e_x$, its spin becomes aligned with that of M.

The net momentum change of the carrier stream is deposited into a volume of (unit area)×$1_m$ as a torque $\Gamma$ on the total moment per unit area on the total moment per unit area $1_m M$: $\Gamma+sn_m \times (n_s \times n_m)$, where s $$s = \left(\frac{h}{2e}\right)\eta^J$$

is the spin current density, J the electrical current density, $$n_m = \frac{M}{|M|}$$

is the unit vector for M, $n_s$ is the unit vector for carrier spin's initial orientation. If M is in an uniaxial anisotropy potential with the easy axis aligned along $e_z$, and a magnetic field $H_\alpha$ is applied along $e_z$, that adds another torque term to the cluster:

$$\Gamma_B = 1_m \frac{\partial U_K(\theta)}{\partial \phi} e_B = 1_m M(H_K \cos\theta + H_\alpha)(n_m \times e_z),$$

where $$H_K = \frac{2K}{M}$$

is the easy-axis switching field, and $$e_B = \frac{n_m x e_z}{|n_m x e_z|}.$$

The dynamics of M can be described by the Landau-Lifshiz-Gilbert equation as:

$$\frac{dn_m}{dt} = \left(\frac{\gamma}{1_m M}\right)(\Gamma + \Gamma_B) - \alpha n_x x \frac{dn_m}{dt} \quad (1)$$

where $\gamma = g \mu_B/h$ is the gyromapetic ratio (assume g=2), and $\alpha$ is the Landau-Gilbert damping coefficient. The effect of a spin current s on M is to add a fictitious excitation field $$H_t(t) = \left(\frac{\hbar}{2e}\right) \eta'(n_s \times n_m)/1_m M.$$

If the excitation exceeds the combined anisotropy field and the applied field, an instability my be caused which eventually flips M. Using the angles defined in FIGS. 6A–6B, for small initial $\theta$, the instability threshold for Equation (1) is $$\left(\frac{s}{1_m M}\right)\cos\phi < -\alpha(H_K + H_\alpha),$$

or with properly defined direction of current:

$$J \rangle J_c \equiv \frac{1}{\eta}\left(\frac{e}{\hbar}\right)\left(\frac{\alpha}{\cos\phi}\right)(1_m M H_K)\left[1 + \left(\frac{H_a}{H_K}\right)\right] \quad (2)$$

For transport through a nanocluster with cross-section area $a^2$ and length $l_m$ as shown in FIG. 6B, Equation (2) leads to a directional net critical current of:

$$I_c = \frac{1}{\eta}\left(\frac{2e}{\hbar}\right)\left(\frac{\alpha}{\cos\phi}\right)(a^2 l_m H_k)\left[1 + \left(\frac{H_\alpha}{H_K}\right)\right] \quad (3)$$

Assuming the transport is dominated by a single magnetic cluster, from the data in FIG. 5, the zero-field $I_c$~1.0 $\mu$A, and the cluster's $H_K \approx 129$Oe judging from the slope of $I_c(H_\alpha)/I_c(O)$. Assuming $\eta$~1, $\Phi=\pi$, and $\alpha$~0.02, this gives an energy term $\alpha^2 l_m M H_e 1.65 \times 10^{-13}$ erg. Assume for this local LSMO cluster M 500 emu/cm$^3$, this gives $\alpha^2 l_m \approx 2.55 \times 10^{-18}$ cm$^3$. Assuming a rather isotropic cluster, $\alpha$~$l_m \approx 137$Å is obtained. This suggests that the transport in this case is dominated by one single cluster at the interface.

Manganite films grown with laser ablation are known to have a fair amount of particulates on the film surface. Hence, it is possible that a nanoparticle having a size of 140Å is trapped at the junction interface, and is responsible for the spin-dependent transport and magnetic switching in this case.

The energy term $\alpha^2 l_m M H_K$ is related to the superparamagnetic transition temperature $T_S$. The thermal transition life-time is $\tau = \tau_0 \exp(E_0/k_B T)$ with $E_0 = \frac{1}{2}a^2 l_m M H_K$, and an attempt frequency of $1/\tau_0$~ln $(\tau/\tau_0)$ ~$10^9$ Hz. Setting a laboratory life-time of $\tau$~1 sec, the superparamagnetic transition temperature $T_S$ is obtained from $E_0/k_B T_S$~ln $(\tau/\tau_0$~20.72, and thus $a^2 l_m M H_K \approx 41.44 k_B T_S$, and $T_S = 30°$ K. Looking at the data in FIG. 4, a prominent feature is shown both in ZFC R(T) and in $R_{high}$ (T) starting at T$\approx 60°$ K., consistent with estimated $T_S$ described above. The premature disappearance of MR at temperatures around 130° K. may be related to superparamagnetic transition of other magnetic clusters present at the interface, perhaps from clusters with somewhat larger energy products than the one observed here.

These results lead to an observation for the operating temperature of the device. According to Equation (3), the critical current for switching the magnetic state of a junction containing a single nanocluster can be written in terms of the superparamagnetic transition temperature $T_S$. For a cluster with uniaxial anisotropy:

$$I_c(O) = \frac{1}{\eta}\left(\frac{2e}{\hbar}\right)\left(\frac{\alpha}{\cos\phi}\right)(41.44 k_B T_s) \quad (4)$$

If room temperature operation is desired, for a quick number estimate assume $T_S$~600° K., and assume the system has $\eta$~0.1 and $\alpha$~0.01, so as to be representative of metal-based ferromagnetic clusters, one has $I_C(0) \approx 104 \mu$A, which is suitable for a current-driven switch for a bi-stable memory element at room temperature. For a Permalloy-based junction, the corresponding nanocluster dimension would be around $\alpha$~300Å.

The switching time $t_0$ of this simple model can be estimated from Equation (1). For a system with uniaxial anisotropy and $I > I_C$:

$$t_0^{-1} \approx \alpha\left(\frac{g\mu_B H_K}{\hbar}\right)\left[\left(\frac{I}{I_c}\right) - 1\right] \quad (5)$$

It is noted that $t_0$ depends only on damping $\alpha$ and the overdrive amplitude $I/I_C$ A typical $\alpha$=0.001 and an overdrive amplitude $I/I_C$=2 give $t_0$~57 ns (for g=2).

The exact position of $I_C$ and the shape of the switching transition in IV characteristics will depend on the magnetic anisotropy of the magnetic cluster, as well as its relative orientation with the local ferromagnetic moment of the electrodes. For manganite-based junctions, the necessary materials growth-control may be problematic. Presently, there is very little consistency with regard to the value of $I_C$ and the shape of the switching characteristics in a junction's IV characteristics.

However, for the many junctions tested by the present inventor, a junction was discovered which appears to contain a most suitable right magnetic anisotropy arrangement which gives an ideal switching characteristic. FIG. 7 shows the result from this junction.

Specifically, FIG. 7 illustrates a junction showing a clean switching characteristic. The device was a LSMO/STO/LSMO junction epitaxially grown on LaAlO$_3$ substrate. Such IV characteristics can be used readily for memory function. With better control of the interface magnetic nanocluster size, such switching characteristic should work suitably at room temperature.

Thus, with the present invention, a tri-layer, spin-dependent magnetoresistive device is produced which shows a large magnetoresistive effect at temperatures below 150° K., as well as a current-driven magnetoresistive switching.

While the invention has been described in terms of a single preferred embodiment, those skilled in the art will recognize that the invention can be practiced with modification within the spirit and scope of the appended claims.

Having thus described my invention, what I claim as new and desire to secure by Letters Latent is as follows:

1. A magnetic switching device, comprising:

a first electrode;

a second electrode; and a nanoparticle having a magnetic moment and being disposed between said first and second electrodes, at least one of said first electrode and said second electrode comprising a magnetic material which has a net spin polarization in its conduction band for injecting, into said nanoparticle, an electrical current including a net spin polarization for overcoming said magnetic moment of said nanoparticle upon selection of a predetermined magnitude for said electrical current, wherein an interaction, between the current injected into the nanoparticle and the magnetic moment of the nanoparticle, switches the magnetic moment of the nanoparticle.

2. The magnetic switching device according to claim 1, wherein said at least one of said first electrode and said second electrode comprises a ferromagnetic material.

3. The magnetic switching device according to claim 1, wherein said first and second electrodes and said nanoparticle in combination comprise a two-terminal junction in which at least one of the leads of the junction is made of ferromagnetically ordered metallic material including conducting magnetic oxides.

4. The magnetic switching device according to claim 1, wherein said ferromagnetic nanoparticle is formed of a ferromagnetic metal.

5. The magnetic switching device according to claim 4, wherein said ferromagnetic metal includes at least one of Fe, Co, $Ni_{1-x}$, $Fe_x$, $CrO_2$, $La_{0.67}Sr_{0.33}MnO_3$, $La_{0.67}Ca_{0.33}MnO_3$, and alloys thereof.

6. The magnetic switching device according to claim 1, wherein at least one of said first and second electrodes and the magnetic nanoparticle are ferromagnetically ordered, and wherein the other of said first and second electrodes is ferromagnetic.

7. The magnetic switching device according to claim 1, wherein at least one of said first and second electrodes and the magnetic nanoparticle are ferromagnetically ordered, and wherein the other of said first and second electrodes is non-ferromagnetic.

8. The magnetic switching device according to claim 1, wherein said magnetic nanoparticle is electrically connected to both of said first and second electrodes, by one of spin-dependent tunneling and another conduction mechanism for preserving the spin-information of the conduction carriers, wherein a relative alignment of the magnetic moment between the magnetic nanoparticle and the at least one of said first and second electrodes determines a two-terminal resistance of the device.

9. The magnetic switching device according to claim 8, wherein a transport current is used to sense said two-terminal resistance of said device, wherein when said transport current is increased beyond a threshold value, a rotation of the magnetic orientation of the magnetic nanoparticle results, thereby changing the device's resistance.

10. The magnetic switching device according to claim 1, wherein said switching device has a bi-stable current-voltage (IV) characteristic, such that a magnetic anisotropy energy, an amount of spin-polarization in a conduction band, and an effective damping coefficient of the nanoparticle determine the position of threshold currents $I_C$ and $-I_C$.

11. The magnetic switching device according to claim 1, wherein depending upon an orientation of the magnetic moment of the nanoparticle with respect to said first and second electrodes, a junction, formed by said first and second electrodes and said nanoparticle, is in one of its resistive-high ($R_{high}$) and its resistive-low ($R_{low}$) state.

12. The magnetic switching device according to claim 11, wherein when a transport current exceeds a threshold current the magnetic moment of the nanoparticle flips, causing a switch of a resistance state thereof.

13. The magnetic switching device according to claim 1, wherein a device characteristic of said nanoparticle has an energy product in a range of above ambient temperature, corresponding to a threshold current $I_C$ of the order of $I_C > \sim 100 \mu A$, and a magnetic nanoparticle having a size of approximately 300Å, wherein a predetermined spin-polarization of a conduction band is substantially within a range of about 0.1 to about 1.0.

14. The switching device according to claim 1, wherein said first and second electrodes and said nanoparticle comprises a magnetic tri-layer junction structure formed of one of $La_{0.67}MnO_3/SrTiO_3/La_{0.67}Sr_{0.33}MnO_3$ and $La_{0.67}MnO_3/SrTiO_3La_{0.67}Ca_{0.33}MnO_3$.

15. A current-driven magnetic switch, comprising:

a first electrode;

a second electrode; and a nanoparticle having a magnetic moment and being disposed between said first and second electrodes, at least one of said first electrode and said second electrode being formed of a ferromagnetic material, wherein an interaction, between the current injected into the nanoparticle and the magnetic moment of the nanoparticle, switches the magnetic moment of the nanoparticle.

16. The switch according to claim 15, wherein said switch has a current-voltage characteristic, such that at least one critical current for a direction of current flow allows switching of the magnetic moment via a transport current.

17. The switch according to claim 16, wherein said switch has a plurality of critical currents for a plurality of directions of current flow for allowing forward and backward reversing of the magnetic moment via said transport current.

18. A current-driven magnetic switch having a current-voltage characteristic, comprising:

a nanoparticle having a magnetic moment, wherein an interaction between said magnetic moment and a spin-polarized current passing directly through said nanoparticle provides at least one critical value for said spin-polarized current, for a direction of current flow, that causes switching of the magnetic moment of the nanoparticle such that said at least one critical value of the current exists that allows the switching of the magnetic moment via a transport current.

19. The switch according to claim 18, wherein said switch has a plurality of critical currents for a plurality of directions of current flow for allowing forward and backward reversing of the magnetic moment via said transport current.

20. The switch according to claim 18, wherein said switch comprises:

a first electrode; and a second electrode, wherein said nanoparticle is disposed between said first and second electrodes, at least one of said first electrode and said second electrode being formed of a ferromagnetic material.

* * * * *